United States Patent
Clarke et al.

(10) Patent No.: US 7,418,680 B2
(45) Date of Patent: Aug. 26, 2008

(54) METHOD AND SYSTEM TO CHECK CORRESPONDENCE BETWEEN DIFFERENT REPRESENTATIONS OF A CIRCUIT

(75) Inventors: Edmund M. Clarke, Mt. Lebanaon, PA (US); Daniel Kroening, Zurich (CH)

(73) Assignee: Carnegie Mellon University, Pittsburgh, PA (US)

( * ) Notice: Subject to any disclaimer, the term of this patent is extended or adjusted under 35 U.S.C. 154(b) by 336 days.

(21) Appl. No.: 11/124,556

(22) Filed: May 6, 2005

(65) Prior Publication Data
US 2005/0210433 A1    Sep. 22, 2005

Related U.S. Application Data

(63) Continuation-in-part of application No. 10/708,056, filed on Feb. 5, 2004.

(51) Int. Cl.
*G06F 17/50* (2006.01)

(52) U.S. Cl. .............................................. 716/5; 716/4

(58) Field of Classification Search ................. 716/3–5, 716/18; 703/13
See application file for complete search history.

(56) References Cited

U.S. PATENT DOCUMENTS 6,131,078 A    10/2000   Plaisted

2003/0191615 A1*  10/2003   Bailey et al. .................. 703/13

OTHER PUBLICATIONS

Carl Pixley, Guest Editor's Introduction: Formal Verification of Commercial Integrated Circuits, IEEE Design & Test of Computers, 18(4):4-5, 2001.
Armin Biere, Alessandro Cimatti, Edmund M. Clarke, and Yunshan Yhu. Symbolic model checking without BDDs. In Tools and Algorithms for Construction and Analysis of Systems, pp. 193-207, 1999.
A. Biere, E. Clarke, R. Raimi, and Y. Zhu. Verifying safety properties of a Power PC™ microprocessor using symbolic model checking without BDDs. In N. Halbwachs and D. Peled, editors, Proceedings of the 11th International Conference on Computer Aided Verification (CAB 99), Lecture Notes in Computer Science. Springer Verlag, 1999.
A. Biere, A.Cimatti, E.M. Clarke, M. Fujita, and Y. Zhu. Symbolic model checking using SAT procedures instead of BDDs. In Design Automation Conference (DAC '99), 1999.
Joao P. Marques-Silva and Karem A. Sakallah. Grasp—A New Search Algorithm for Satisfiability. In Proceedings of IEEE/ACM International Conference on Computer-Aided Design, pp. 220-227, Nov. 1996.

(Continued)

*Primary Examiner*—Vuthe Siek
(74) *Attorney, Agent, or Firm*—Charles L. Moore; Moore & Van Allen, PLLC

(57) ABSTRACT

A method to check correspondence between different representations of a circuit may include abstracting a first computer language representation of the circuit to form a first abstract model of the circuit and abstracting a second computer language representation of the circuit to form a second abstract model of the circuit. The method may also include forming a product machine using the first and second abstract models. The method may further include checking correspondence between the first and second abstract models using the product machine.

22 Claims, 12 Drawing Sheets

OTHER PUBLICATIONS

Matthew W. Moskewicz, Conor F. Madigan, Ying Zhao, Lintao Zhang, and Sharad Malik. Chaff: Engineering an efficient SAT solver. In Proceedings of the 38th Design Automation Conference (DAC '01), Jun. 2001.

D. Kroening and O. Strichman. Efficient computation of recurrence diameters. In Proceedings of the Fourth International Conference on Verification, Model Checking and Abstract Interpretation. Springer, 2003. To appear.

O. Shtrichman. Tuning SAT checkers for bounded model checking. In E.A. Emerson and A.P. Sistla, editors, Proceedings of the 12th International Conference on Computer Aided Verification (CAV 2000), Lecture Notes in Computer Science. Springer Verlag, 2000.

Fady Copty, Limor Fix, Ranan Fraer, Enrico Giunchiglia, Gila Kamhi, Armando Tacchella, and Moshe Y. Vardi. Benefits of bounded model checking at an industrial setting. In Gerard Berry, Hubert Comon, and Alain Finkel, editors, Proceedings of the 13th International Conference on Computer Aided Verification (CAV 2001), No. 2102 in Lecture Notes in Computer Science, pp. 436-453. Springer Verlag, 2001.

Per Bjesse, Tim Leonard, and Abdel Mokkedem. Finding bugs in an Alpha microprocessor using satisfiability solvers. In Gerard Berry, Hubert Comon, and Alain Finkel, editors, Proceedings of the 13th International Conference on Computer Aided Verification (CAV 2001), No. 2102 in Lecture Notes in Computer Science, pp. 454-464. Springer Verlad, 2001.

Luc Semeria, Andrew Seawright, Renu Mehra, Daniel Ng, Arjuna Ekanayake, and Barry Pangrle. RTL C-based methodology for designing and verifying a multi-threaded processor. In Proc. Of the 39th Design Automation Conference ACM Press, 2002.

I. Page. Constructing Hardware-Software Systems from a Single Description. Journal of VLSI Signal Processing, 1291):87-107, 1996.

A. Pnueli, M. Siegel, and O. Shtrichman. The code validation tool (CVT)—automatic verification of a compilation process. Int. Journal of Software Tools for Technology Transfer (STTT), 2(2):192-201, 1998.

R. Cytron, J. Ferrante, B.K. Rosen, M.N. Wegman, and F.K. Zadeck. An efficient method of computing static single assignment form. In Proceedings of the 16th ACM SIGPLAN-SIGACT symposium on Principles of programming languages, pp. 25-35. ACM Press, 1989.

David W. Currie, Alan J. Hu, and Sreeranga Rajan. Automatic formal verification of dsp software. In Proceedings of the 37th Design Automation Conference (DAC 2000), pp. 130-135. ACM Press, 2000.

Kiyoharu Hamaguchi. Symbolic simulation heuristics for high-level design descriptions with uninterpreted functions. In International Workshop on High-Level Design, Validation, and Test, pp. 25-30. IEEE, 2001.

C. Blank, H. Eveking, J. Levihn, and G. Ritter. Symbolic simulation—state of the art and applications. In International Workshop on High-Level Design, Validation, and Test, pp. 45-50. IEEE, 2001.

Apt., Krzysztof R. Logics and Models of Concurrent Systems, NATO ASI Series, Series F: Computer and System Sciences, vol. 13, no date.

T. Ball and S. Rajamani, Automatically Validating Temporal Safety Properties of Interfaces. In The 8th International SPIN Workshop on Model Checking of Software, vol. 2057 of LNCS, pp. 103-122. Springer, May 2001.

T. Ball and S. Rajamani, Boolean Programs: A Model and Process For Software Analysis. Technical Report 2000-14, Microsoft Research, Feb. 2000.

S.K. Lahiri, R.E. Byrant, and B. Cook. A symbolic approach to predicate abstraction. In W.A. Hunt and F. Somenzi, editors, *Computer-Aided Verification (CAV)*, No. 2725 in LNCS, pp. 141-153. Springer-Verlag, Jul. 2003.

E. Clarke, D. Kroening and K. Yorav, Behavioral Consistency of C and Verilog Programs Using Bounded Model Checking. In Proceedings of DAC 2003, pp. 368-371. ACM Press, 2003.

E. Clarke, D. Kroening, N. Sharygina and K. Yorav, Predicate Abstraction of ANSI-C Programs using SAT. In Proc. Of the Model Checking for Dependable Software-Intensive Systems Workshop, San Francisco, USA, 2003.

A. Gupta, Z. Yang, P. Ashar and A. Gupta, SAT-Based Image Computation with Application in Reachability Analysis. in Formal Methods in Computer-Aided Design (FMCAD), No. 1954 in LNCS, pp. 354-372, 2000.

S. Graf and H. Saidi, Construction of Abstract State Graphs With PVS. In O. Grumberg, editor, Proc. 9th International Conference on Computer Aided Verification (CAV '97), vol. 1254, pp. 72-83. Springer Vrlag, 1997.

D. Detlefs, G. Nelson and J. Saxe, Simplify: A Theorem Prover For Program Checking. Technical Report HPL-2003-148, HP Labs, Jul. 2003.

E. Clarke, O. Gumberg and D. Long, Model Checking and Abstraction. In Principles of Programming Lanuages, Jan. 1992.

E. Clarke, M. Talupur, and D. Wang. SAT based predicate abstraction for hardware Verification. In *Proceedings* of SAT '03, May 2003.

D. Plaisted, A. Biere and Y. Zhu, A SatisfiabilityTester for Quantified Boolean Formulae. Journal of Discrete Applied Mathematics (DAM), 2003.

J.E. Smith and A.R. Pleszkun. Implementing Precise Interrupts in Pipelined Processors. IEEE Transactions on Computers, 37(5):562-573, 1988.

R. Tomasulo. An Efficient Algorithm For Exploiting Multiple Arithmetic Units, IBM Journal of Research and Development, 11(1):25-33, 1967.

K. McMillan. Applying SAT Methods in Unbounded Symbolic Model Checking. In 14th Conference on Computer Aided Verification, pp. 250-264, 2002.

Clarke, Edmund M. Jr., et al., Model Checking, (1999) United States.

Kurshan, Robert P., Computer-Aided Verification of Coordinating Processes, The Automata-Theorectic Approach (1994) Princeton University Press.

Matumoto, Takeshi, et al., Equivalence Checking in C-based Hardware Descriptions by Using Symbolic Simulation and Program Slicer, In *International Workshop on Logic Synthesis (IWLS '03)*, 2003.

\* cited by examiner

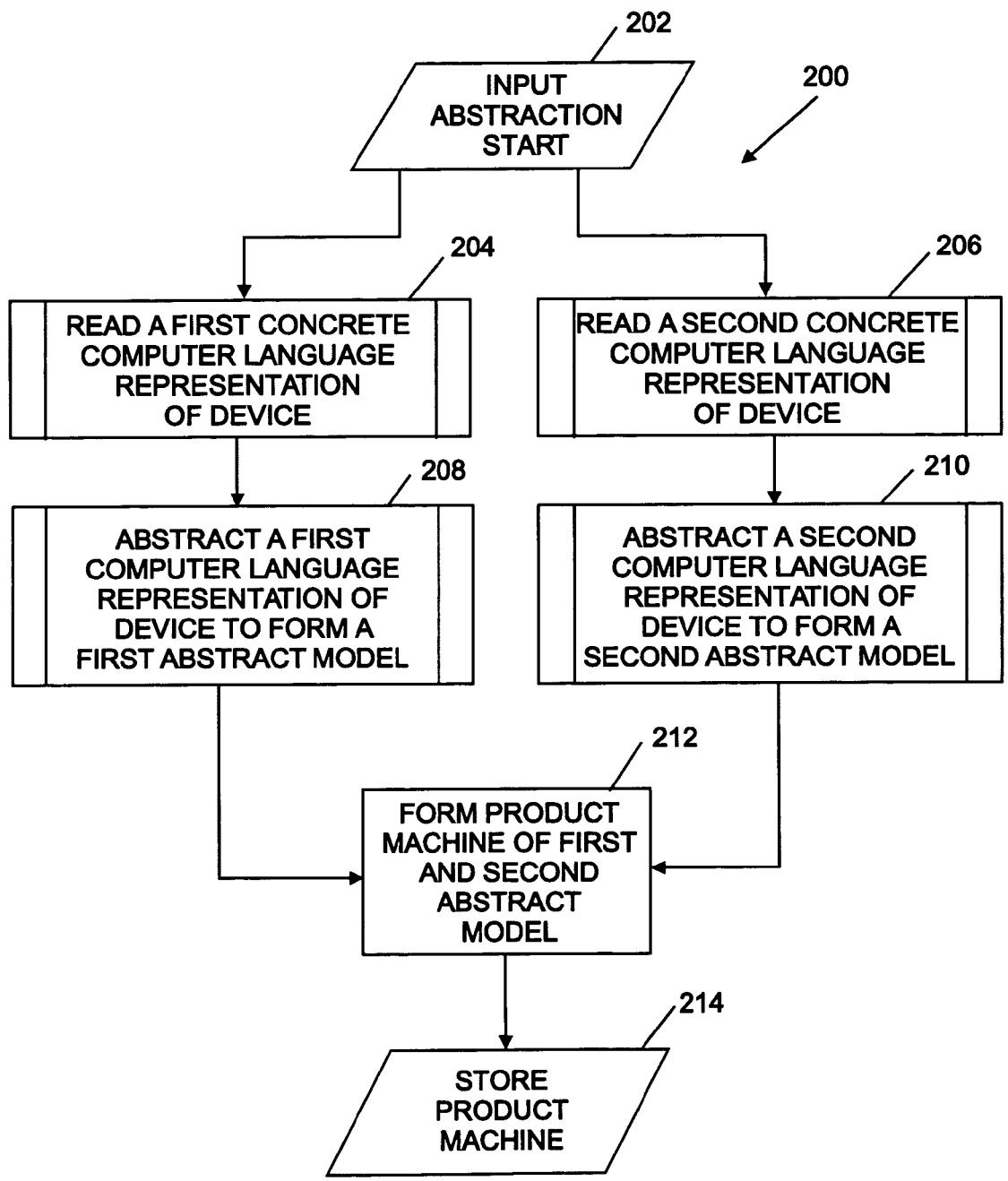

METHOD AND SYSTEM TO CHECK CORRESPONDENCE BETWEEN DIFFERENT REPRESENTATIONS OF A CIRCUIT

CROSS REFERENCE TO RELATED APPLICATIONS

This application is a continuation-in-part of U.S. patent application Ser. No. 10/708,056, filed Feb. 5, 2004, entitled "Method and System to Verify a Circuit Design," which is assigned to the same assignee as this application and is incorporated herein in its entirety by reference.

BACKGROUND OF INVENTION

The present invention relates to electronic or digital circuits or the like, and more particularly to a method and system to check correspondence between representations of a circuit in one computer language, such as a hardware design language (HDL) or the like, and another language, such as C or the like.

When a new device, such as an electronic or digital circuit or the like, is designed, a "golden model" or simulation model may be written in a programming language, such as ANSI-C or a similar programming language. This model together with any embedded software that may run on the device is typically extensively simulated and tested to insure both correct functionality and performance. The device is also typically simulated in a hardware description language (HDL), such as Verilog® or the like. Testing and simulating the circuit in a programming language such as C is easier and faster compared to an HDL language; although, the HDL representation may be used to generate the actual circuit or commercial product. Rather than performing extensive testing on the HDL representation, the product development cycle can be much more efficient using the programming language representation for testing. However, consistency between the programming language model or representation and the HDL model or representation with respect to inputs and outputs must be verified to insure that the models or representations are viable tools and provide accurate results in simulating and testing the new device or circuit. Previous methods of verification can involve complex operations and provide inaccurate results.

SUMMARY OF INVENTION

In accordance with an embodiment of the present invention, a method to check correspondence between different representations of a circuit may include abstracting a first computer language representation of the circuit to form a first abstract model of the circuit and abstracting a second computer language representation of the circuit to form a second abstract model of the circuit. The method may also include forming a product machine using the first and second abstract models. The method may further include checking correspondence between the first and second abstract models using the product machine.

In accordance with another embodiment of the present invention, a system to check correspondence between different representations of a circuit may include a processor and a data structure operable on the processor to abstract a first computer language representation of the circuit to form a first abstract model of the circuit. The system may also include another data structure operable on the processor to abstract a second computer language representation of the circuit to form a second abstract model of the circuit. The system may additionally include a data structure to form a product machine using the first and second abstract models. The system may further include a data structure to check correspondence between the first and second abstract models using the product machine.

In accordance with another embodiment of the present invention, a computer-readable medium having computer-executable instructions for performing a method to check correspondence between different representations of a circuit may include abstracting a first computer language representation of the circuit to from a first abstract model of the circuit. The method may also include abstracting a second computer language representation of the circuit to form a second abstract model of the circuit. The method may additionally include forming a product machine using the first and second abstract models. The method may further include checking correspondence between the first and second abstract models using the product machine.

DESCRIPTION OF THE DRAWINGS

FIG. 2A is a flow chart of an exemplary method to form a product machine of abstract models of different representations of a circuit in accordance with an embodiment of the present invention.

DETAILED DESCRIPTION

The following detailed description of preferred embodiments refers to the accompanying drawings, which illustrate specific embodiments of the invention. Other embodiments having different structures and operations do not depart from the scope of the present invention.

Figure 1:
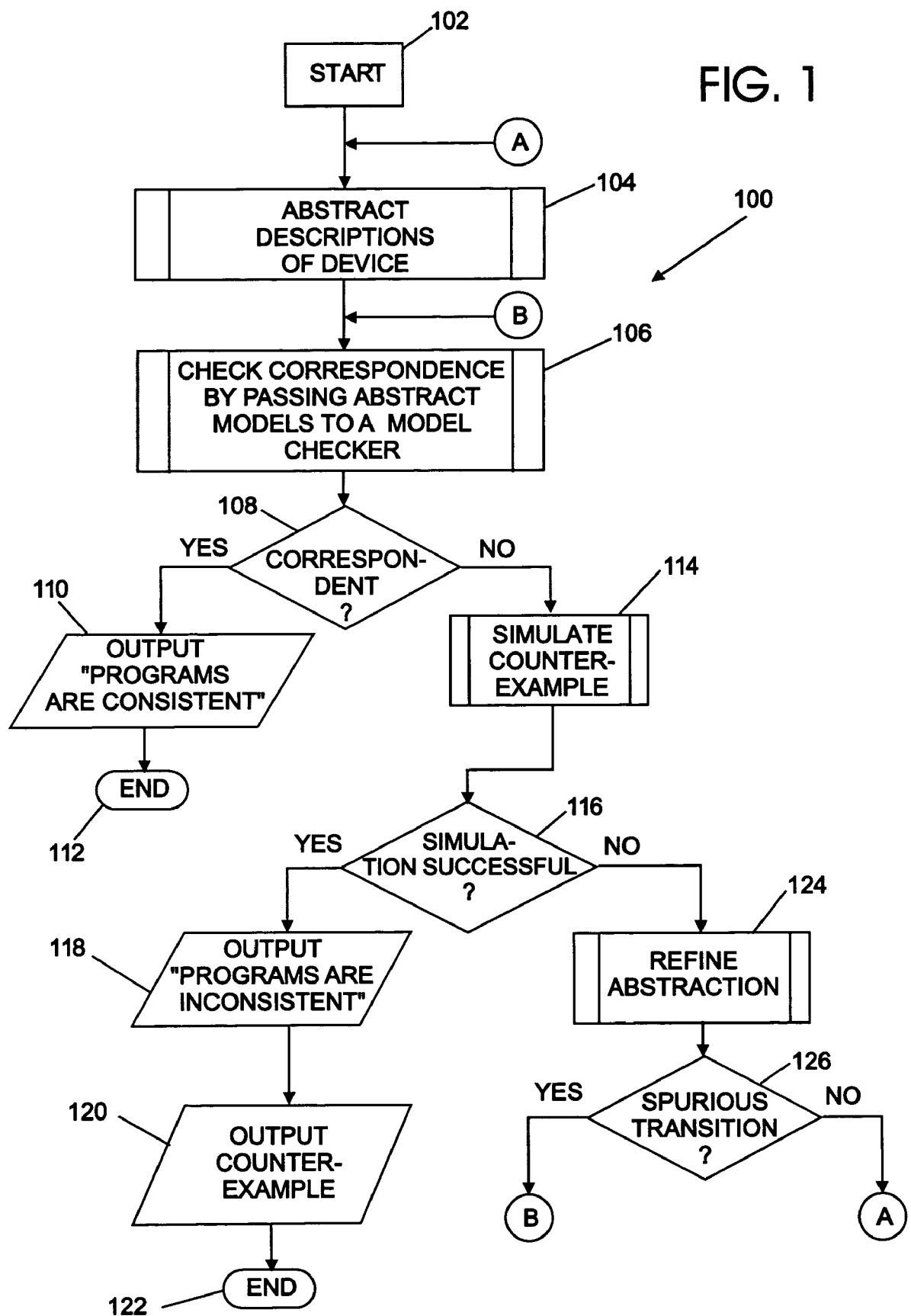
FIG. 1 is a flow chart of an exemplary method to check correspondence between different representations of a circuit in accordance with an embodiment of the present invention.

FIG. 1 is a flow chart of an exemplary method 100 to check correspondence between different computer language representations of a circuit in accordance with an embodiment of the present invention. As will be discussed in more detail herein, one computer language representation may be a hardware description language (HDL), such as Verilog®, very high speed integrated circuit hardware descriptive language (VHDL) or the like. The other computer language representation may be a programming language, such as ANSI-C, SystemC or similar programming language. In block 102, the method 100 may start. In block 104, descriptions of the circuit or device may be abstracted to form abstract models and to form a product machine. An example of a method for abstracting the descriptions or computer language representations of the circuit and forming the product machine will be described in more detail with reference to a method 200 in FIG. 2. In block 106, correspondence may be checked by passing abstract models to a model checker or running a model checker on the product machine. Model checking and examples of model checkers are described in the book *Model Checking*, by Edmund Clarke, et al., MIT Press, 2000. Model checkers are also available commercially, such as those from Cadance, Inc. of San Jose, Calif.

In block 108, a determination may be made whether there is correspondence between the abstract models for each computer language representation by running a model checker on the product machine. If there is correspondence between the abstract models, the method 100 may advance to block 110 and the method 100 may output or present an indication, such as "programs are consistent" or similar indication to a user or operator. Under these circumstances, the different computer language representations of the circuit or device are consistent or corresponding. The method 100 may then end at termination block 112.

Returning to block 108, if a determination is made in block 108 that there is no correspondence between the abstract models for each computer language representation, the method 100 may advance to block 114. In block 114, a counterexample may be simulated. If the model checker in block 106 finds that the abstract models are inconsistent or do not correspond, the model checker may generate a counterexample that may demonstrate this inconsistency. The generation of counterexamples is discussed in detail in *Model Checking* by Clarke et al. The counterexample that may be generated by the model checker only demonstrates that the abstract models are inconsistent. This inconsistency may not be present in the actual circuits. An example of simulating the counterexample will be described in more detail with respect to the method 700 in FIG. 7.

In block 116, a determination may be made whether the simulation of the counterexample was successful. If the simulation was successful in decision block 116, the method 100 may advance to block 118. In block 118, an indication, such as "programs or computer language representations are inconsistent" or a similar indication may be outputted or presented to a user or operator. In block 120, the counterexample may be outputted or presented to the user. The counterexample may be helpful to the user in identifying a cause of the problem or inconsistency. The circuit representations may be modified to overcome the inconsistency. The method 100 may then end at termination 122.

Returning to decision block 116, if the simulation of the counterexample is not successful, the method 100 may advance to block 124. In block 124, the abstraction or abstract models of the computer language representations of the circuit may be refined. An example of refining the abstraction will be described in more detail with respect to method 800 of FIG. 8. In block 126, a determination may be made whether there is a spurious transition. If there is no spurious transition, the method 100 may then return to block 104 and the method 100 may proceed as previously described using the refined abstraction. If there is a spurious transition in block 126, the method 100 may return to block 106 and the method 100 may proceed as previously described.

FIG. 2A is a flow chart of an exemplary method 200 to form a product machine of abstract models of different representations of a circuit or device in accordance with an embodiment of the present invention. Method 200 may be used to perform at least a portion of the functions or operations represented by block 104 in FIG. 1. In block 202, the input abstraction may be started. In block 204, a first concrete computer language representation of the circuit or device may be read or downloaded from a predetermined data storage location or the like. In block 206, a second concrete computer language representation of the circuit or device may be read or downloaded from a predetermined data storage location or the like. As previously discussed, the first computer language representation may be may be an HDL computer language representation or the like and the second computer language representation may be a program language representation, such as C or similar language. Forming a concrete HDL representation of the circuit will be described in more detail with reference to the method 300 in FIG. 3 and forming a concrete programming language representation of the circuit or device will be described in more detail with reference to method 400 in FIG. 4.

In block 208, the first computer language representation of the circuit or device may be abstracted to form a first abstract model. In block 210, the second computer language representation of the circuit may be abstracted to from a second abstract model. While the operations in blocks 204 and 208 are shown in a parallel path with blocks 206 and 210, the operations or functions represented by these blocks are not necessarily performed simultaneously or alternatively to one another.

Figure 2B:
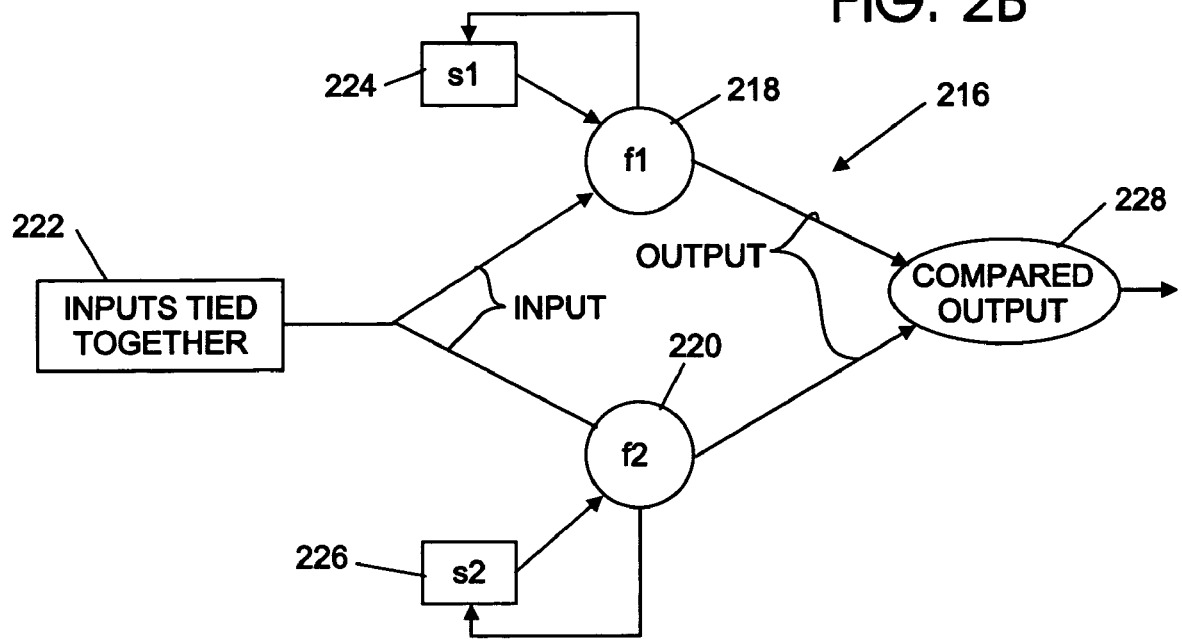
FIG. 2B is a block diagram of an exemplary product machine in accordance with an embodiment of the present invention.

In block 212, a product machine may be formed using the first and second abstract models. FIG. 2B is a block diagram of an example of a product machine 216 in accordance with an embodiment of the present invention. The product machine 216 may be a combination of two machines, "f1" 218 and "f2" 220. These two combinational functions define the abstract model of each representation of the circuit. After building the product machine, the behavior of the product machine 216 may be restricted such that (a) the two machines "f1" 218 and "f2" 220 must read the same inputs which may be tied together in block 222 and (b) the two machines 216 and 218 must synchronize on one or more shared events. As an example, such an event may be a raising or falling edge of a designated clock signal, a specific value on a data bus, or the state of a state machine. The shared events may be used to synchronize clock domains. The two devices may not be cycle-accurate. The output from both machines 218 and 220 may be compared in block 228. The result of this comparison may be used to establish correspondence between the two machines. The comparison may be performed continuously, or only in case of designated output events.

Figure 9:
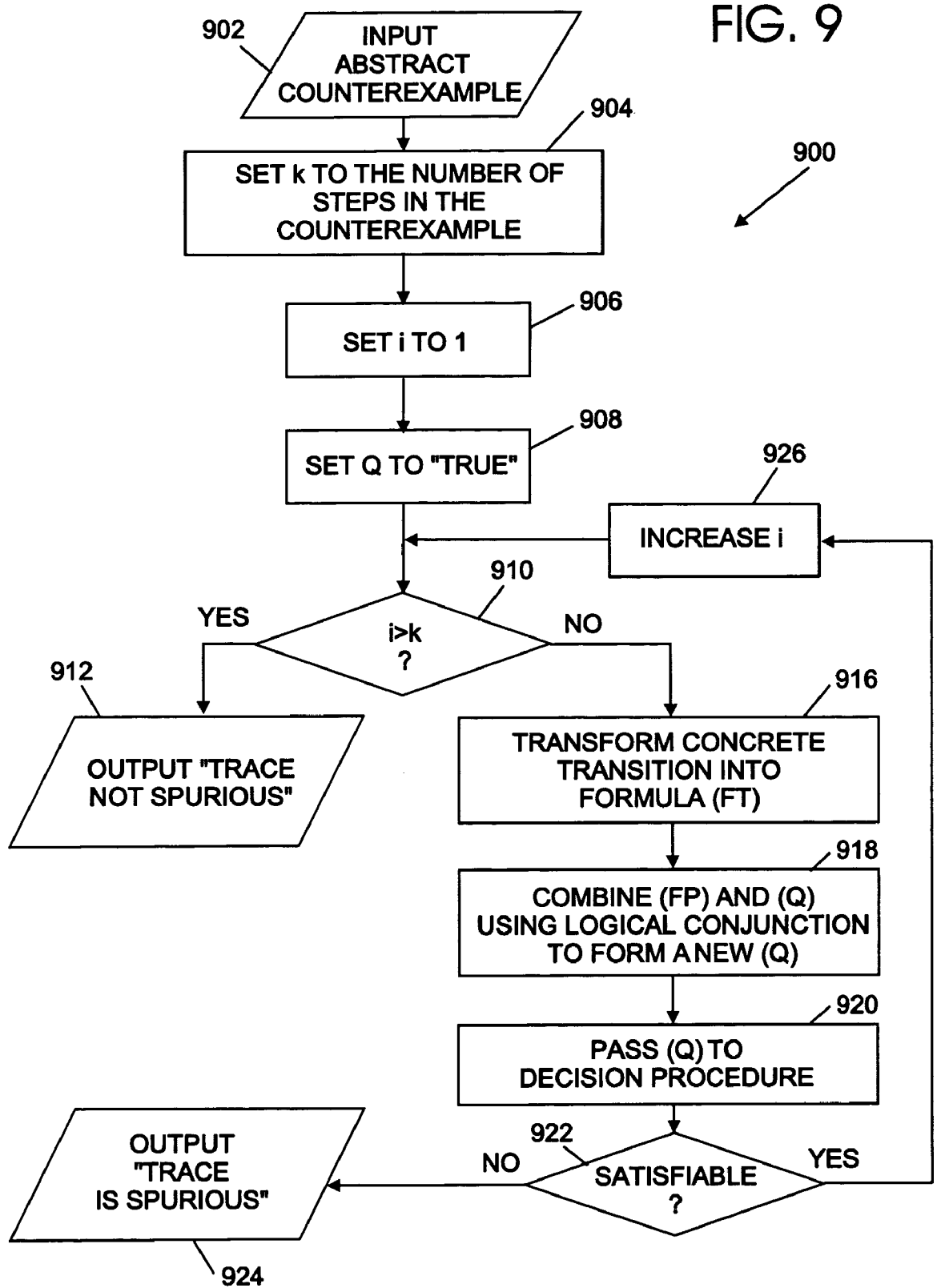
FIG. 9 is a flow chart of an exemplary method for simulating a trace on a concrete machine to detect any spurious traces related to a counterexample in accordance with an embodiment of the present invention.

Returning to FIG. 2A, in block 214, the product machine may be stored in a predetermined location in a system for checking correspondence between different representations of a circuit, such as system 900 of FIG. 9 or the like.

Figure 3:
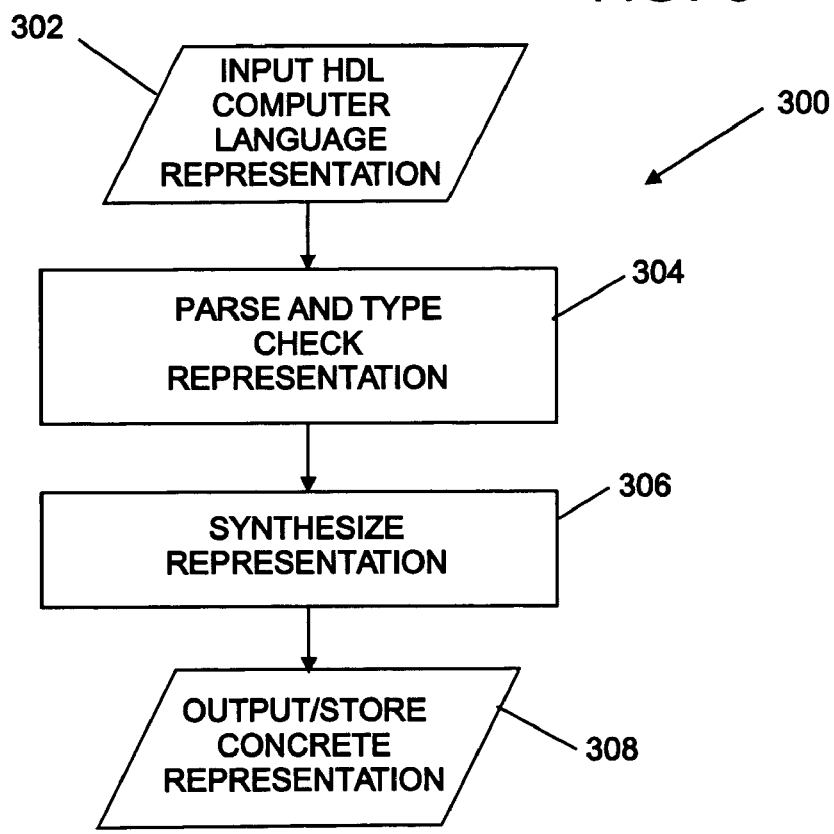
FIG. 3 is a flow chart of an exemplary method to transform a HDL computer language representation or the like of a circuit to a concrete representation in accordance with an embodiment of the present invention.

FIG. 3 is a flow chart of an exemplary method 300 to transform a HDL computer language representation or the like of a circuit to a concrete representation in accordance with an embodiment of the present invention. The method 300 is an example of a method that may be used to transform a first computer language or HDL representation of a circuit or device to provide a first concrete computer language representation of the circuit or device in block 204 of the method 200 of FIG. 2. In block 302, a computer language representation, HDL representation or the like of a device or circuit may be inputted, read or retrieved from a data source, such as a user-specified source or file. In block 304, the file or representation may be parsed and checked for type consistency. This operation may be similar to that performed by any circuit synthesis tool. The parsing and checking type consistency may be dependent upon the HDL. For example, the hardware description may be separated into components and checked for type errors (caused by using variables or expressions with incompatible types together), syntax errors or other errors. In block 306, the representation or circuit description may be synthesized into a register transfer level (RTL) description. This operation or function may be similar to such operations performed by industry standard synthesis tools. Optionally, this operation may preserve non-determinism if contained in the circuit description. In block 308, a resulting concrete representation of the circuit may be stored in a data source, for example as a file, and outputted or presented to the user.

Figure 4:
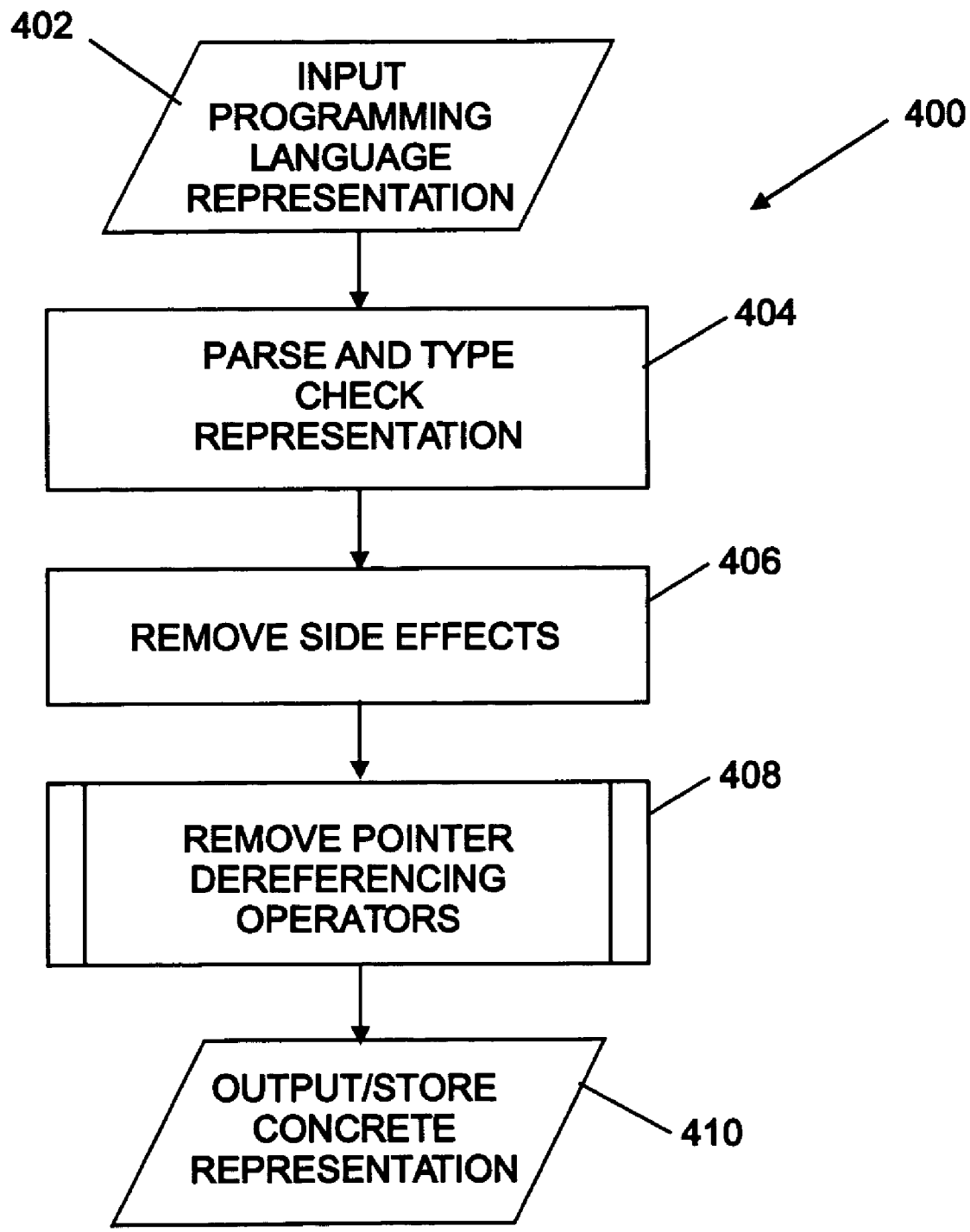
FIG. 4 is a flow chart of an exemplary method to transform a programming language representation or the like of a circuit to a concrete representation in accordance with an embodiment of the present invention.

FIG. 4 is a flow chart of an exemplary method 400 to transform a programming language representation, such as a C-type language or the like, of a circuit to a concrete representation in accordance with an embodiment of the present invention. The method 400 is an example of a method that may be used to transform a second computer language or programming language representation of a circuit or device to provide a second concrete computer language representation of the circuit or device in block 206 of the method 200 of FIG. 2. In block 402, the computer language or program language representation of the device or circuit may be inputted, loaded or read from a data source, such as a file, that may be specified by the user. In block 404, the representation may be parsed and checked for type consistency. This operation or function may be similar to that performed by an ANSI-C compiler or the like. In block 406, side effects in the representation or program may be removed by in-lining functions and expanding prefix and postfix operators and compound assignment operators. In block 408, pointer dereferencing operators may be removed. In block 410, the concrete representation may be outputted or stored in a data source as a file.

Figure 5:
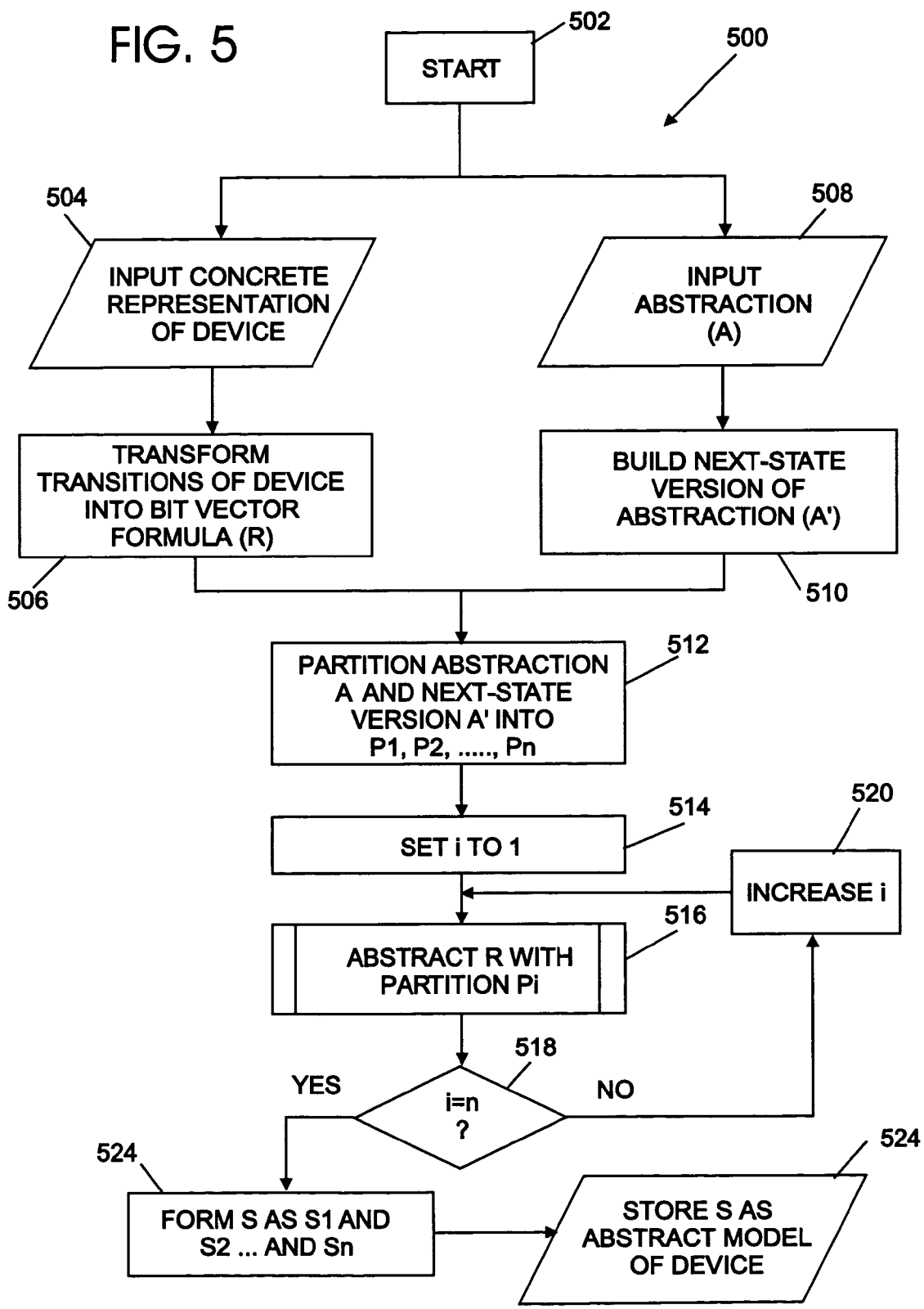
FIG. 5 is a flow chart of an exemplary method to form an abstract model of the circuit in accordance with an embodiment of the present invention.

FIG. 5 is a flow chart of an exemplary method 500 to form an abstract model of the circuit in accordance with an embodiment of the present invention. The method 500 may be used to from the abstract models in blocks 208 and 210 of the method 200 of FIG. 2. The method 500 may start at block 502. In block 504, the concrete representation of the circuit may be inputted or read from a predetermined data source. The concrete representation for the HDL computer language representation may be formed or created by method 300 of FIG. 3. The concrete representation for the programming language representation may be formed or created by method 400 in FIG. 4. In block 506, the transitions or representation of the circuit or device from block 504 may be transformed into a bit vector formula (R) or equation. Forming bit vector equations is known and described in "Automatically Validating Temporal Safety Properties of Interfaces," by T. Ball and S. K. Rajamani, *The 8$^{th}$ International SPIN Workshop on Model Checking of Software,* Volume 2057 of LNCS, pages 103-122, Springer, May 2001, and "Construction of Abstract State Graphs," by S. Graf and H. Saida, *Proceedings of 9$^{th}$ International Conference on Computer Aided Verification (CAV '97),* volume 1254, pages 72-83. Springer Verlag, 1997.

In block 508, an abstraction (A) of the computer language representation of the circuit may be inputted. The initial abstraction is empty and may be refined and stored in block 806 as will be described with respect to method 800 of FIG. 8. In block 510, a next-state version of the abstraction (A') may be built or formed. There are various forms of abstraction, e.g., localization reduction or predicate abstraction. When abstracting a transition system, the abstraction has to be applied to the current state and the state after the transition took place. For example, in a predicate abstraction, the abstraction is given by means of a set of predicates. Assuming the variables that refer to the state of the system before the transition are denoted by "x" and "y", an example for the predicates over these variables may be:

$x=1$ $y>x$

Assuming the variables in the transition system that refer to the state after transition are denoted by x' and y' (i.e., the variables that refer to the state before the transition plus prime). The two predicates above can be transformed into their next state version by simply adding a prime to each variable:

$x'=1$ $y'>x'$

This way of transformation is completely arbitrary and the present invention may apply to any way of using an abstraction on a transition system.

While blocks 504 and 506 are shown in a parallel path with blocks 508 and 510, the operations or functions represented by these blocks are not necessarily performed simultaneously nor are the operations alternatives to one another.

In block 512, the abstraction (A) and next-state version of the abstraction (A') may be partitioned to form partition $P_i$ or partitions, $P_1, P_2, \ldots, P_n$. The partitioning may be done heuristically. In block 514, the index (i) may be set to equal 1. In block 516, the bit vector formula (R) may be abstracted with the partition $P_i$. This will be explained with respect to method 600 in FIG. 6. In block 518, a determination may be made whether i equals n or whether all partitions, $P_1$-$P_n$, have been abstracted with bit vector formula or equation (R). If i does not equal n in block 518, the method 500 may advance to block 520. In block 520, i may be increased or incremented to the next higher index number and the method 500 may return to block 516 where the next partition $P_{i+1}$ may be abstracted with the bit vector formula (R).

If i does equal n in block 518, the method 500 may advance to block 522. In block 522, an abstract model, S, may be formed that corresponds to the concrete representation inputted in block 504. The abstract model S may be represented by each partition $P_1$-$P_n$ abstracted by the bit vector formula (R) in block 516 and "ANDED" together or inputted into a logic AND gate. That is, S may equal $S_1$ AND $S_2$ . . . AND $S_n$. In block 524, S may be stored in a data storage device or system as an abstract model of the circuit or device. Accordingly, a separate abstract model may be computed for each partition, wherein a partition is a subset of the predicates and their next-state versions. Therefore, n abstract models may be obtained. The final abstract model may be obtained by building the "AND" over all the abstract models, i.e., behavior must be allowed by all the abstract models in order to be allowed by the final abstract model.

Figure 6:
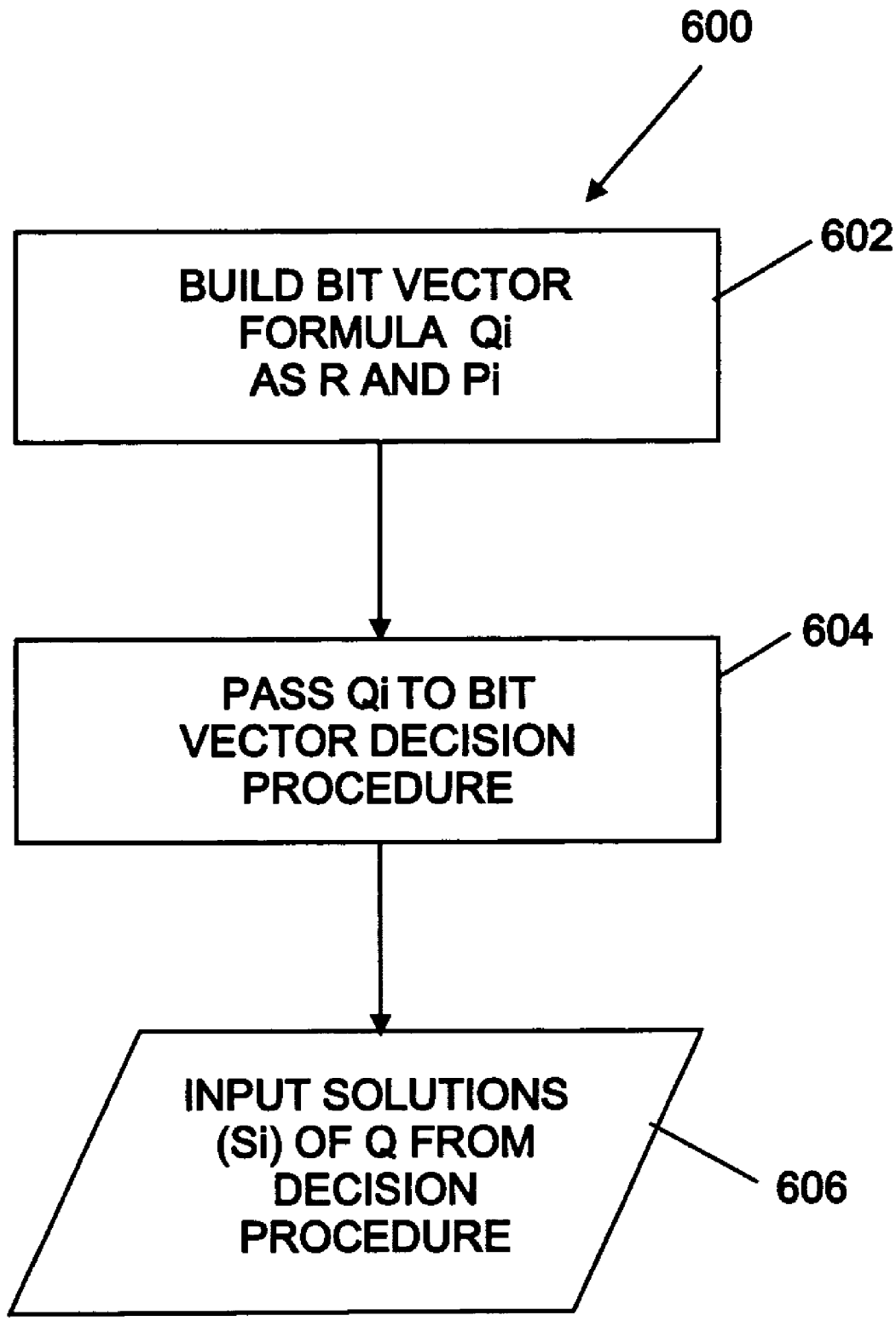
FIG. 6 is a flow chart of an exemplary method to obtain an abstract model for a specific partition in accordance with an embodiment of the present invention.

FIG. 6 is a flow chart of an exemplary method 600 to abstract the bit vector formula (R) with the partition Pi in accordance with an embodiment of the present invention. The method 600 may be used to perform the operation of block 516 in FIG. 5. In block 602, a bit vector formula $Q_i$ may be built or formed as bit vector formula (R) "ANDED" or applied to an input of an AND gate with the predicates of partition $P_i$. In block 604, the bit vector formula or equation $Q_i$ may be passed to a decision procedure or a decision procedure may be applied to the bit vector formula or equation $Q_i$. An example of a decision procedure is described in U.S. patent application Ser. No. 10/708,056, filed Feb. 5, 2004, entitled "Method and System to Verify a Circuit Design." In block 606, all the solutions ($S_i$) of the bit vector equation Q are inputted from the decision procedure in block 606. The solutions of the equation Q correspond to the abstract transition relation.

Figure 7:
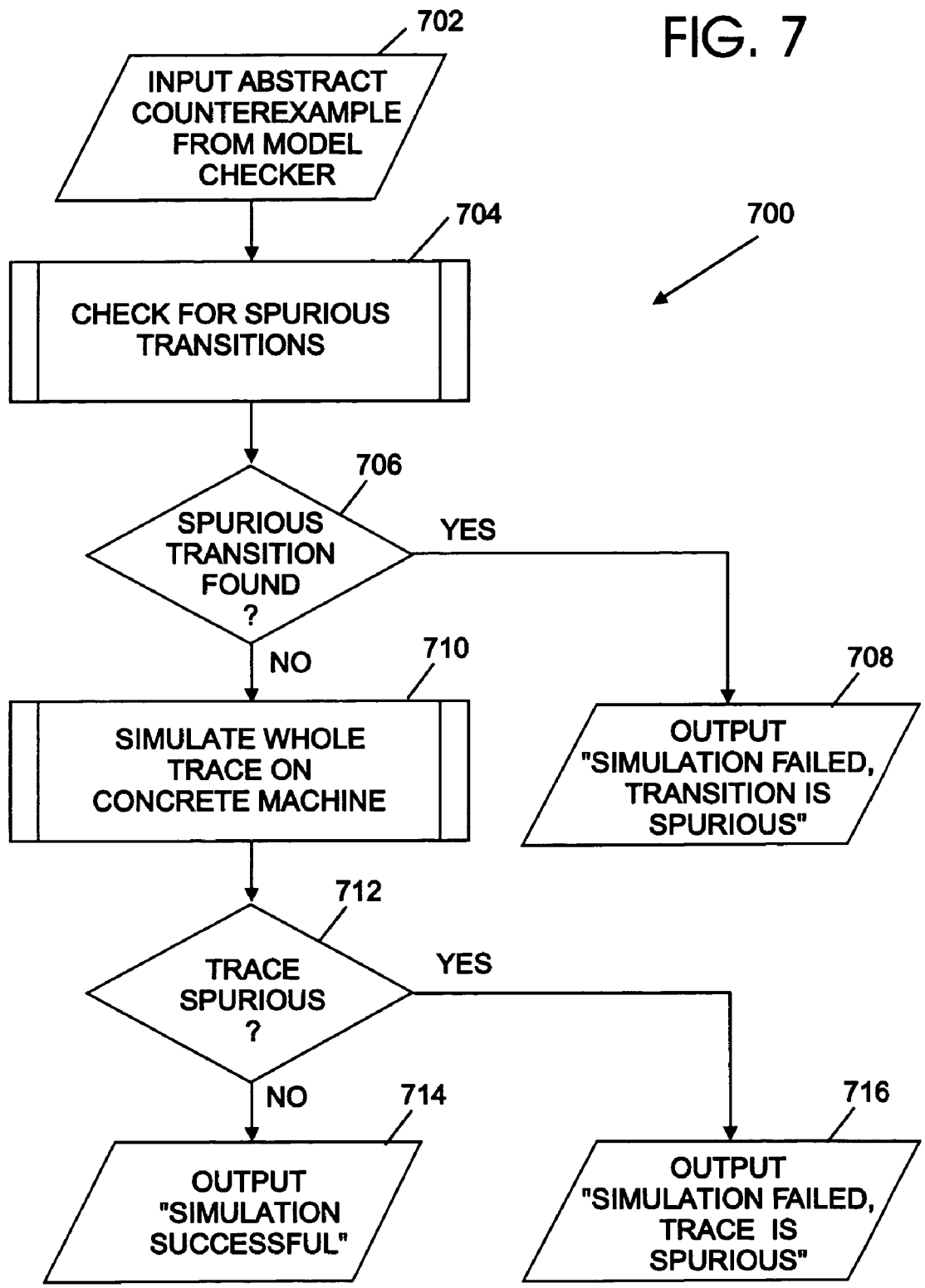
FIG. 7 is a flow chart of an exemplary method to simulate a counterexample in accordance with an embodiment of the present invention.
Figure 8:
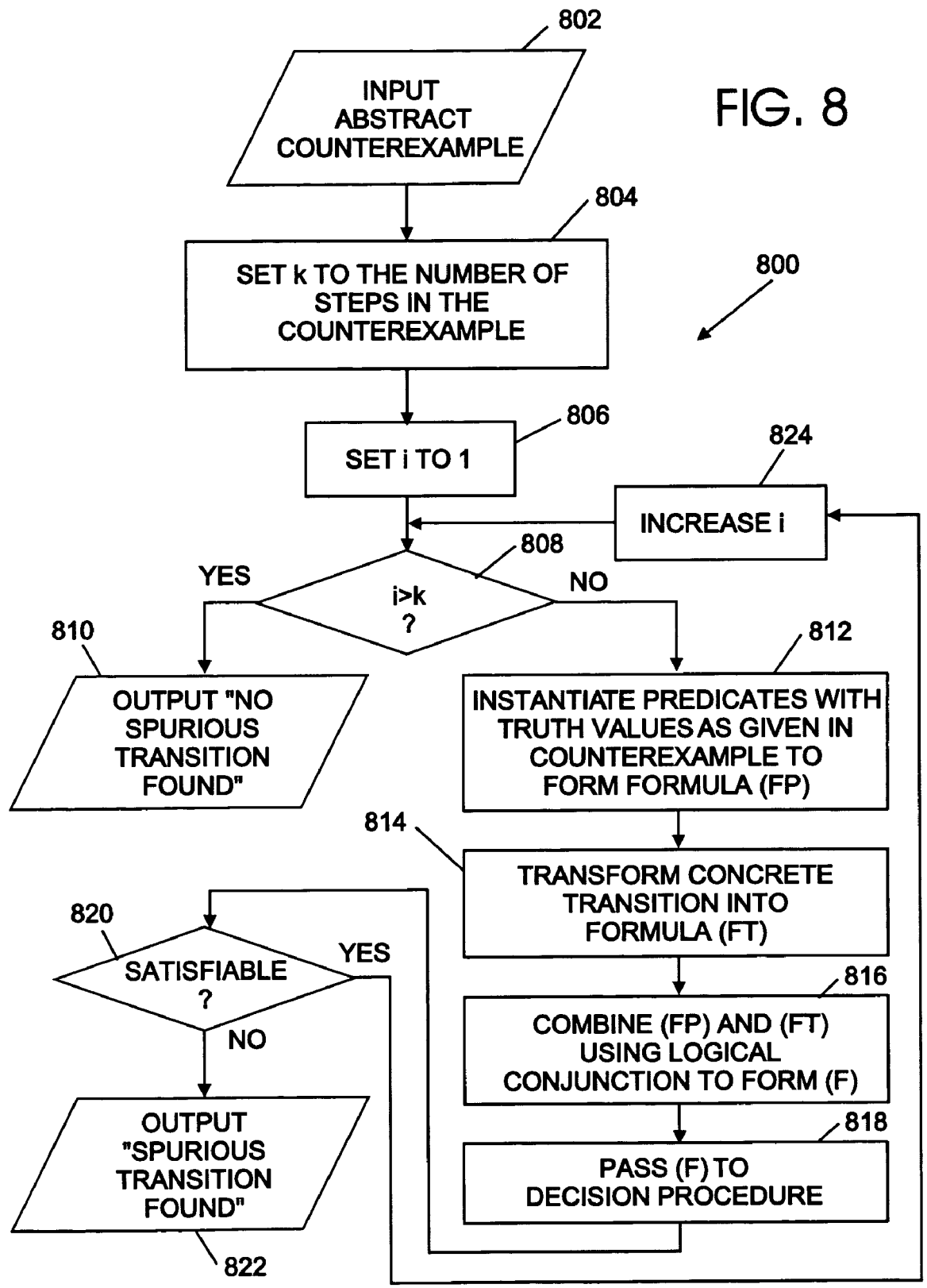
FIG. 8 is a flow chart of an exemplary method for checking for spurious transitions in accordance with an embodiment of the present invention.

FIG. 7 is a flow chart of an exemplary method 700 to simulate a counterexample in accordance with an embodiment of the present invention. The method 700 may be used for the operation or function in block 114 of FIG. 1. In block 702, an abstract counterexample may be inputted from the model checker. In block 704, a check for spurious transitions may be performed. FIG. 8 is a flow chart of an exemplary method for checking for spurious transitions and will be described in detail below with reference to FIG. 8. In block 706, a determination may be if any spurious transitions were found. If spurious transitions were found, the method 700 may advance to block 708. In block 708, an indication such as "simulation failed, transition is spurious" or similar indication may be outputted or presented to a user. If no spurious transitions were found in block 706, the method 700 may advance to block 710. In block 710, a whole trace on a concrete machine may be simulated to detect any spurious traces related to the counterexample. FIG. 9 is a flow chart of an exemplary method for simulating a trace on a concrete machine to detect any spurious traces related to a counterexample and will be discussed in detail with reference to FIG. 9 below.

In block 712, a determination may be made whether the trace is spurious. If a determination is made in block 712 that the trace is not spurious, the method 700 may advance to block 714. In block 714, an indication such as "simulation successful" or the like may be outputted or presented to the user. If the trace was spurious in block 712, the method 700 may advance to block 716. In block 716, an indication such as "simulation failed, trace is spurious" or similar indication may be outputted or presented to the user.

As previously mentioned, FIG. 8 is a flow chart of an exemplary method 800 for checking for spurious transitions in accordance with an embodiment of the present invention. In block 802, an abstract counterexample may be inputted from the model checker. In block 804, k may be set to the number of steps in the counterexample. In block 806, i may be set to 1. In block 808, a determination may be made if i is greater than k. If i is greater than k in block 808, the method 800 may advance to block 810. In block 810, an output may be generated and presented to the user indicating that no spurious transitions were found.

If i is not greater than k in block 808, the method 800 may advance to block 812. In block 812, predicates may be instantiated with truth values as given in the counterexample to form formula (FP). As an example, consider the predicate "x=1". If the truth value given in the counterexample is "true" or 1, the instantiated predicate remains "x=1". If the truth value given in the counterexample is "false" or 0, the instantiated predicate becomes the negation, i.e., "x≠1". The formula (FP) may be built as the conjunction or logical "AND" of all the predicates. In block 814, the concrete transition may be transformed into formula (FT), as described previously with respect to block 506. In block 816, formula (FP) and formula (FT) may be combined using logical conjunction or applied as inputs of an "AND" gate to form (F). In block 818, (F) may be passed to a decision procedure, as described previously with reference to block 604. In block 820, a determination may be made whether the decision procedure found the formula (F) to be satisfiable or not. If the decision procedure found (F) to be not satisfiable in block 820, the method may advance to block 822. In block 822, an output may be generated and presented to a user indicating that a spurious transition was found. If the decision procedure found (F) to be satisfiable in block 820, i may be increased in block 824 and the method 800 may return to block 808. The method 800 may then proceed as previously described.

FIG. 9 is a flow chart of an exemplary method 900 for simulating a trace on a concrete machine to detect any spurious traces related to a counterexample in accordance with an embodiment of the present invention. In block 902, an abstract counterexample may be inputted or entered. In block 904, k may be set to the number of steps in the counterexample. In block 906, i may be set to one (1). In block 908, Q may be set to "TRUE".

In block 910, a determination may be made whether i is greater than k. If the response in block 910 is yes, an output may be generated and present to the user in block 912 that may indicate that the trace is not spurious. If the response in block 910 is no, the method 900 may advance to block 914. In block 916, a concrete transition of the device may be transformed into formula (FT). In block 918, (FP) and (Q) may be combined using a logical conjunction to from a new (Q). In block 920 (Q) may be passed to a decision procedure. In block 922, a decision procedure determinations whether (Q) is satisfiable. An incremental decision procedure may be used. An example of an incremental decision procedure is described in U.S. patent application Ser. No. 09/990,390, entitled "Sharing Information between Instances of a Propositional Satisfiability (SAT) Problem". If the decision procedure is not satisfiable in block 922, an output may be generated and presented to a user to indicate that the output is spurious in block 924. If the decision procedure is satisfiable in block 922, i may be increased in block 926 and the method 900 may return to block 910. The method 900 may then proceed as previously described.

Figure 10:
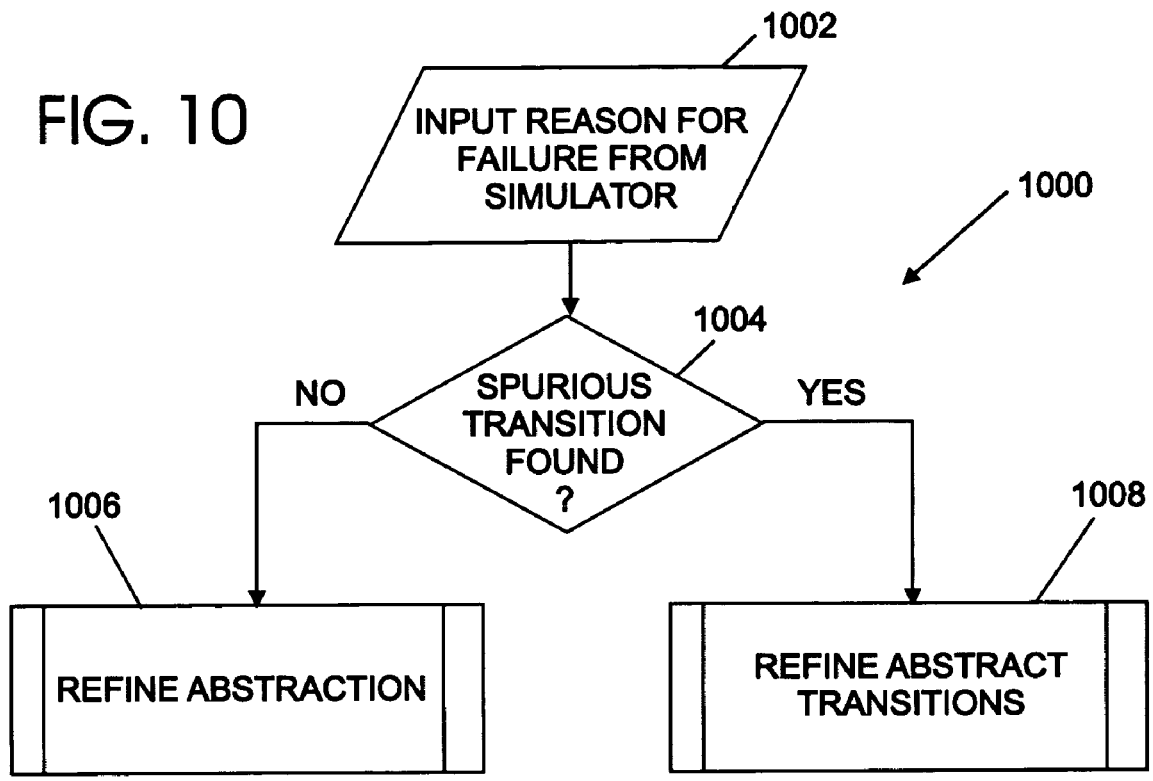
FIG. 10 is a flow chart of an exemplary method to refine an abstraction or refine abstract transitions in accordance with an embodiment of the present invention.
Figure 11:
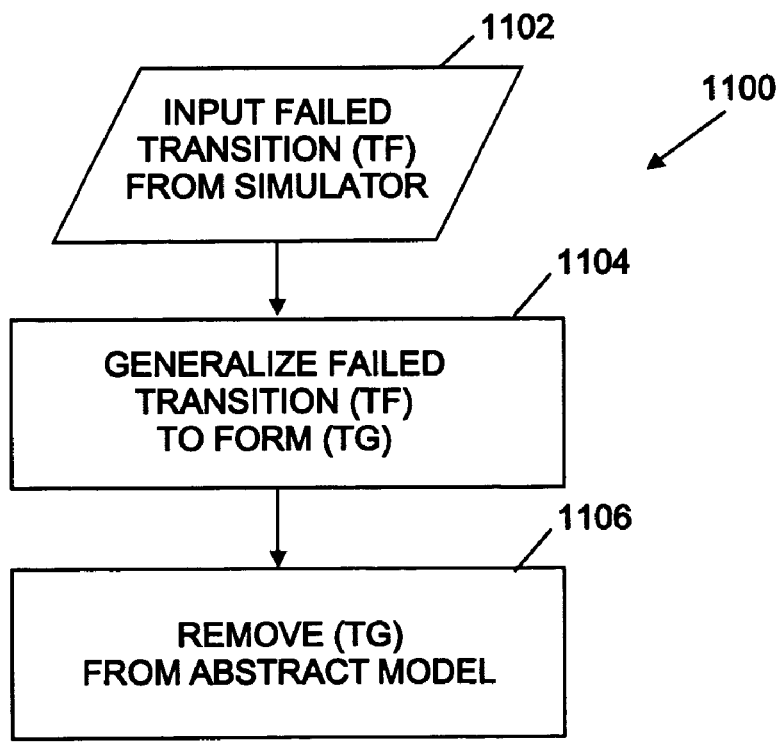
FIG. 11 is a flow chart of an exemplary method for refining abstract transitions in accordance with an embodiment of the present invention.
Figure 12:
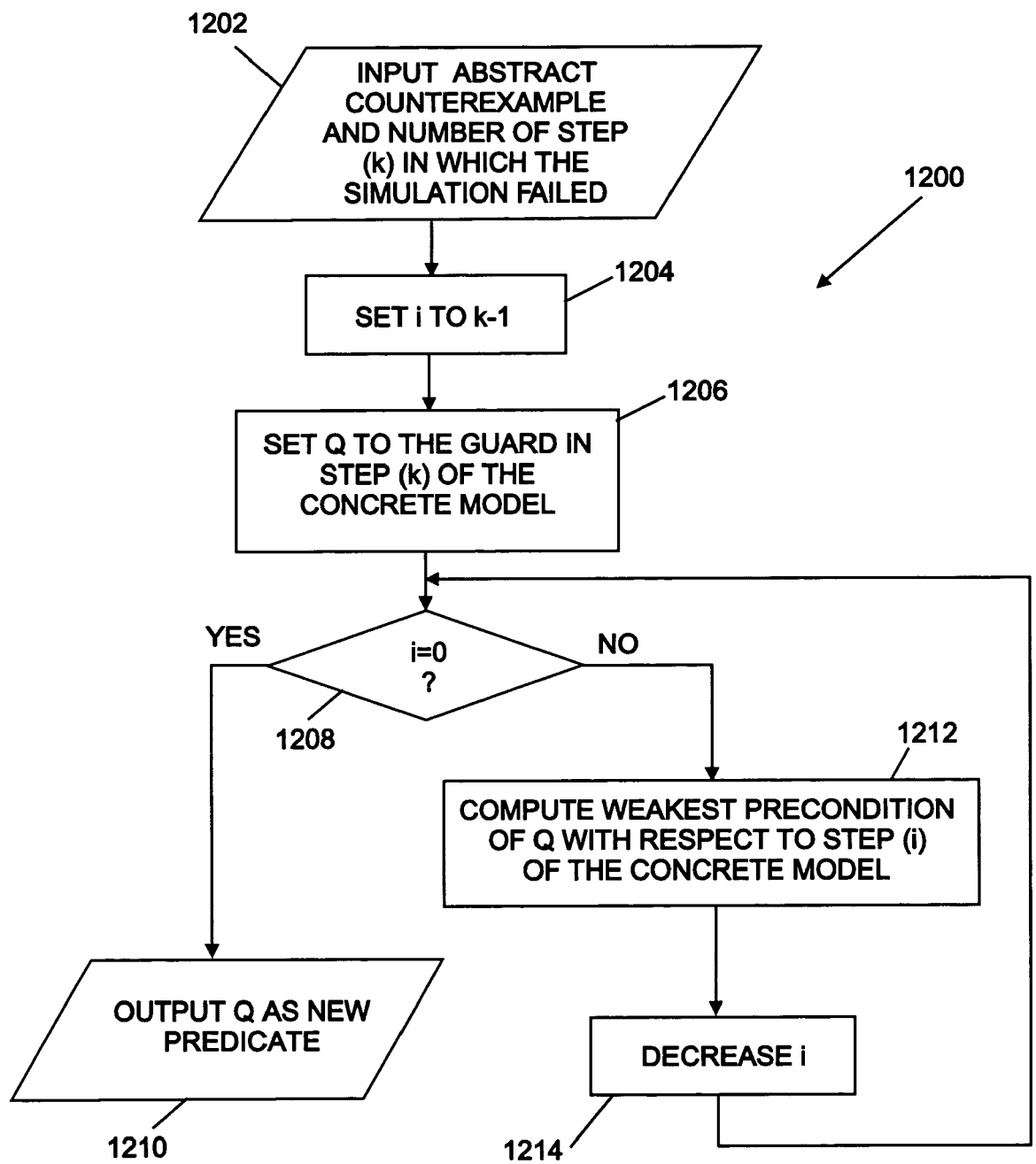
FIG. 12 is a flow chart of an exemplary method for refining the abstraction in the case of a spurious trace in accordance with an embodiment of the present invention.

FIG. 10 is a flow chart of an exemplary method 1000 to refine an abstraction or refine abstraction transitions in accordance with an embodiment of the present invention. The method 1000 may be used for the operation in block 124 of method 100 of FIG. 1. The method 1000 may also follow from block 708 or 716 of method 700 of FIG. 7. In block 1002, a reason for failure from the simulator or counterexample simulation of method 700 may be inputted. In block 1004, a determination may be made whether a spurious transition was found as the reason for the simulation failure. If a determination is made in block 1004 that a spurious transition was not found, the method 1000 may advance to block 1006. In block 1006 the abstraction of the circuit description or representation may be refined. FIG. 12 is a flow chart of an exemplary method 1100 for refining an abstraction of a circuit or device in accordance with an embodiment of the present invention. If a determination is made in block 1004 that a spurious transition was found, the method 1000 may advance to block 1008. In block 1008, abstract transitions may be refined. FIG. 11 is a flow chart of an exemplary method 1200 for refining an abstract transition in accordance with an embodiment of the present invention.

Referring to FIG. 11, in block 1102, a failed transition (TF) from the simulator in FIG. 8 may be inputted. This is the truth assignment to predicates given in the counterexample used in the failing step during the simulation in block 812. This single assignment (TF) may be generalized to form (TG) to remove additional spurious transitions from the abstract model. This may be done by inspecting the reason for the transition being spurious. In block 1106, (TG) may be removed from the abstract model."

Referring to FIG. 12, in block 1202, an abstract counterexample may be inputted from the model check and the number of the step (k) in which the simulation failed may be inputted from the simulator in FIG. 9. In block 1204, i may be set to k−1. In block 1206, Q may be set to the guard in step (k) of the concrete model. In block 1208, a determination may be made whether i equals 0. If i does equal 0 in block 1208, Q may be outputted as a new predicate in block 1210. If i does not equal 0 in block 1208, the method 1200 may advance to block 1212. In block 1212, the weakest precondition of Q may be computed with respect to step (i) of the concrete model. In block 1214, i may be decreased and the method 1200 may return to block 1208. The method 1200 may then proceed as previously described.

Figure 13:
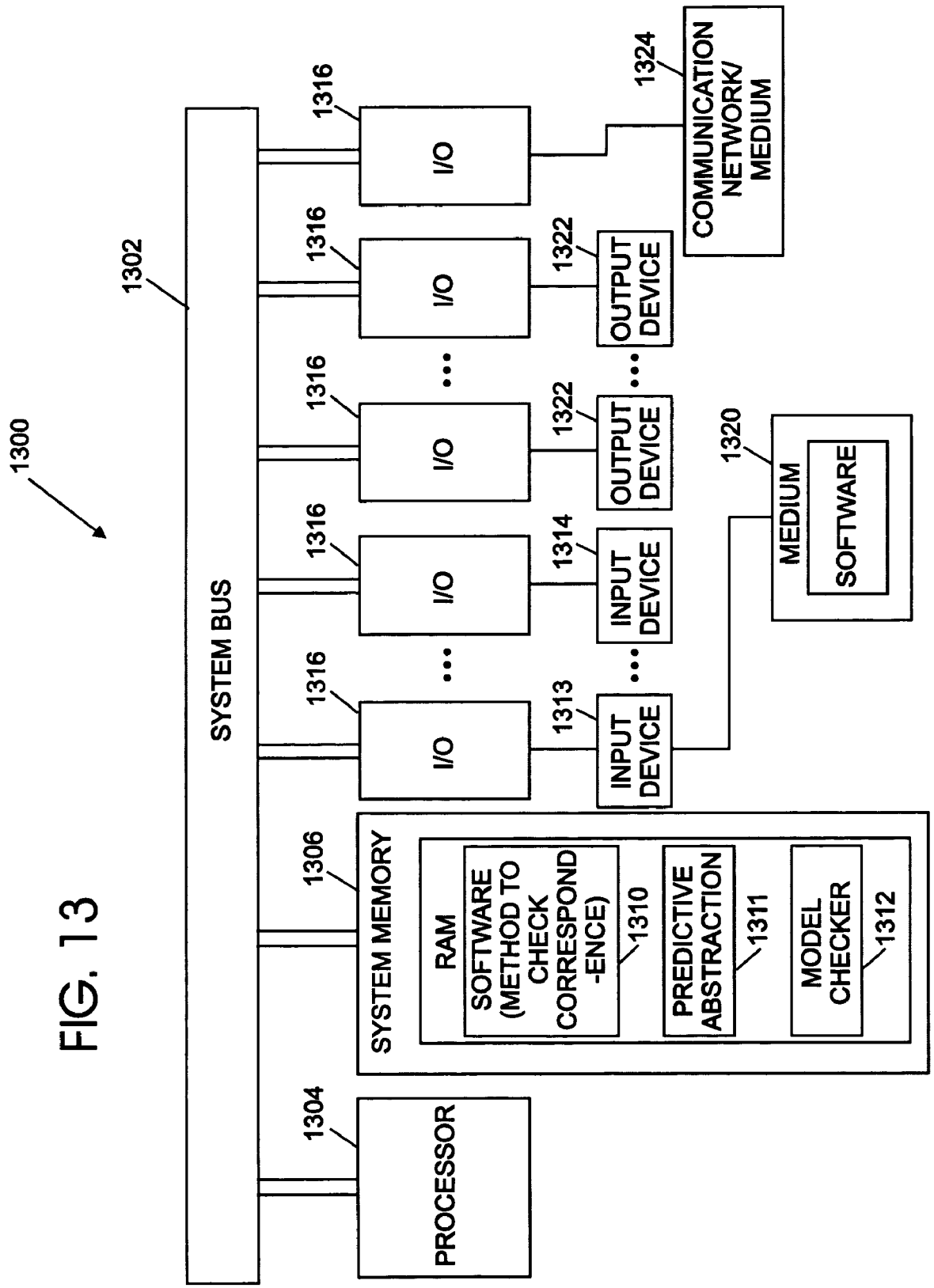
FIG. 13 is a block diagram of an exemplary system adapted to check correspondence between different representations of a circuit in accordance with an embodiment of the present invention.

FIG. 13 is a block diagram of an exemplary system 1300 adapted to check correspondence between different representations of a circuit in accordance with an embodiment of the present invention. The methods 100-1200 may be implemented by and embodied in the system 1300. The system 1300 may include a system bus 1302. The system 1300 may also include a processor 1304 that may be coupled to the system bus 1302. A system memory 1306 may also be coupled to the system bus 1302. The system memory 1306 may include a random access memory (RAM) 1308 or the like to store software 1310 or data structures. The methods 100-1200 may be embodied as software 1310, computer-usable or computer-executable instructions or data structures stored in the system memory 1306. The memory 1306 may include a predicate abstraction 1311 to check correspondence between a first computer language representation and a second computer language representation of a circuit or device. The system memory 1306 may also include a model checker 1312 to check correspondence between a first and a second abstract model, such as abstract models formed by method 200 of FIG. 2. One or more input devices 1312 and 1314 may also be coupled to the system bus 1302 via an input/output interface 1316 or the like. The input devices 1312 may be optical, magnetic, infrared, voice recognition or radio frequency input devices or the like. The input devices 1312 may receive, read or download software or the like, such as software embodying the methods 100-1200, from a medium 1320. Examples for the medium 1320 may be or form part of a communication channel, memory or similar devices. The medium 1320 may be any medium that may contain, store, communicate or transport the data embodied thereon for use by or in connection with the input device 1312 or the system 1300. The medium 1320 may, for example, be an electronic, magnetic, optical, infrared or semiconductor system or the like. The medium 1320 may also be simply a stream of information being retrieved when the data is "downloaded" through a network such as the Internet or a private network. The input devices 1314 may be a keyboard, pointing device or the like.

One or more output devices 1322 may also be coupled to the system bus 1302 via an I/O interface 1316 or the like. The output devices 1322 may include a display or monitor, printer, audio system or the like. The output devices 1322 may be used to present indications to a user related to operation of the methods 100-1200, such as the indications in blocks 118 (FIG. 1), 708, 714 and 716 (FIG. 7). The system 1300 may also be coupled to a communication network or medium 1324. The communication medium or network 1324 may be coupled to the system bus 1302 via an I/O interface 1316 or the like. The communication network or medium 1324 may be any communication system including by way of example, dedicated communication lines, telephone networks, wireless data transmission systems, two-way cable systems, customized computer networks, interactive kiosk networks, the Internet and the like.

Elements of the present invention, such as methods 100-1200 may be embodied in hardware and/or software as a computer program code that may include firmware, resident software, microcode or the like. Additionally, elements of the invention may take the form of a computer program product on a computer-usable or computer-readable storage medium having computer-usable or computer-readable program code embodied in the medium for use by or in connection with a system, such as system 1300 of FIG. 13. Examples of such a medium may be illustrated in FIG. 13 as input devices 1312 or media 1320 and 1324. A computer-usable or readable medium may be any medium that may contain, store, communicate or transport the program for use by or in connection with a system. The medium, for example, may be an electronic, magnetic, optical, electromagnetic, infrared or semiconductor system or the like. The medium may also be simply a stream of information being retrieved when the computer program product is "downloaded" through a network such as the Internet. The computer-usable or readable medium could also be paper or another suitable medium upon which the program may be printed.

Although specific embodiments have been illustrated and described herein, those of ordinary skill in the art appreciate that any arrangement which is calculated to achieve the same purpose may be substituted for the specific embodiments shown and that the invention has other applications in other environments. This application is intended to cover any adaptations or variations of the present invention. The following claims are in no way intended to limit the scope of the invention to the specific embodiments described herein.

What is claimed is:

1. A method to check correspondence between different representations of a circuit, comprising:

abstracting a first computer language representation of the circuit to form a first abstract model of the circuit;

abstracting a second computer language representation of the circuit to form a second abstract model of the circuit;

forming a product machine by combining the first abstract model and the second abstract model;

checking or determining correspondence between the first and second abstract models;

presenting an indication that the first and second computer language representations are consistent in response to correspondence between the first and second abstract models;

simulating a counterexample in response to no correspondence between the first and second abstract models; and presenting an indication that the first and second computer language representations are inconsistent in response to the simulation of the counterexample being successful.

2. The method of claim 1, further comprising using predicate abstraction to check correspondence between the first computer language representation and the second computer language representation of the circuit.

3. The method of claim 1, wherein checking correspondence between the first and second abstract models comprises using a model checker.

4. The method of claim 1, further comprising refining an abstraction of the first and second abstract models in response to a simulation of the counterexample failing and a spurious trace being found.

5. The method of claim 1, further comprising checking the simulation of the counterexample for any spurious transitions.

6. The method of claim 1, further comprising refining an abstract transition for the first and second abstract models in response to the simulation of the counterexample failing and any spurious transitions being found.

7. The method of claim 6, further comprising simulating a whole trace of the counterexample on a concrete machine in response to no spurious transitions being found.

8. The method of claim 7, further comprising providing an indication that the simulation was successful in response to the trace not being spurious.

9. The method of claim 1, wherein abstracting each of the first and second computer language representations to form each of the first and second abstract models of the circuit comprise:
   inputting a concrete representation of the circuit;
   transforming transitions of the circuit into a bit vector formula;
   inputting an abstraction of the circuit;
   building a next-state version of the abstraction;
   partitioning the abstraction and next-state abstraction to form a plurality of predicates; and
   abstracting the bit vector formula with the plurality of predicates to form one of the first or second abstract models of the circuit.

10. The method of claim 1, further comprising generating and presenting the counterexample to assist a user in identifying a cause of any inconsistency.

11. A system to check correspondence between different representations of a circuit, comprises:
   a processor;
   a data structure operable on the processor to abstract a first computer language representation of the circuit to form a first abstract model of the circuit;
   a data structure operable on the processor to abstract a second computer language representation of the circuit to form a second abstract model of the circuit;
   a data structure operable on the processor to form a product machine by combining the first abstract model and the second abstract model;
   a data structure operable on the processor to check or determine correspondence between the first and second abstract models;
   an output device to present an indication that the first and second computer language representations are consistent in response to correspondence between the first and second abstract models; and
   a data structure operable on the processor to simulate a counterexample in response to no correspondence between the first and second abstract models, wherein an indication that the first and second computer language representations are inconsistent is presentable by the output device in response to the simulation of the counterexample being successful.

12. The system of claim 11, further comprising a predicate abstraction to check correspondence between the first computer language representation and the second computer language representation of the circuit.

13. The system of claim 11, further comprising a model checker to check correspondence between the first and second abstract models.

14. The system of claim 11, further comprising a data structure to refine an abstraction of the first and second abstract models in response to a simulation of the counterexample failing and a spurious trace being found.

15. The system of claim 11, further comprising a data structure to refine an abstract transition for the first and second abstract models in response to a simulation of the counterexample failing and a spurious transition being found.

16. The system of claim 11, further comprising a data structure to check the counterexample for spurious transitions.

17. The system of claim 11, wherein the data structure to abstract each of the first and second computer language representations to form each of the first and second abstract models of the circuit comprise:
   a data structure to input a concrete representation of the circuit;
   a data structure to transform transitions of the circuit into a bit vector formula;
   a data structure to input an abstraction of the circuit;
   a data structure to build a next-state version of the abstraction;
   a data structure to partition the abstraction and next-state abstraction to form a plurality of predicates; and
   a data structure to abstract the bit vector formula with the plurality of predicates to form one of the first or second abstract models of the circuit.

18. A computer storage medium having computer-executable instructions for performing a method to check correspondence between different representations of a circuit, the method comprising:
   abstracting a first computer language representation of the circuit to form a first abstract model of the circuit;
   abstracting a second computer language representation of the circuit to form a second abstract model of the circuit;
   forming a product machine by combining the first abstract model and the second abstract model;
   checking or determining correspondence between the first and second abstract models;
   presenting an indication that the first and second computer language representations are consistent in response to correspondence between the first and second abstract models;
   simulating a counterexample in response to no correspondence between the first and second abstract models; and
   presenting an indication that the first and second computer language representations are inconsistent in response to the simulation of the counterexample being successful.

19. The computer storage medium having computer-executable instructions for performing the method of claim 18, wherein the method further comprises using predicate abstraction to check correspondence between the first computer language representation and the second computer language representation of the circuit.

20. The computer storage medium having computer-executable instructions for performing the method of claim 18, wherein checking correspondence between the first and second abstract models comprises using a model checker.

21. The computer storage medium having computer-executable instructions for performing the method of claim 18, wherein the method further comprises refining an abstraction of the first and second abstract models in response to a simulation of the counterexample failing and a spurious trace being found.

22. The computer storage medium having computer-executable instructions for performing the method of claim 18, wherein the method further comprises refining an abstract transition for the first and second abstract models in response to a simulation of the counterexample failing and a spurious transition being found.

* * * * *